(12) United States Patent
Moens et al.

(10) Patent No.: US 10,644,127 B2
(45) Date of Patent: May 5, 2020

(54) PROCESS OF FORMING AN ELECTRONIC DEVICE INCLUDING A TRANSISTOR STRUCTURE

(71) Applicant: SEMICONDUCTOR COMPONENTS INDUSTRIES, LLC, Phoenix, AZ (US)

(72) Inventors: Peter Moens, Erwetegem (BE); Abhishek Banerjee, Kruibeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/662,622

(22) Filed: Jul. 28, 2017

(65) Prior Publication Data

US 2019/0035910 A1 Jan. 31, 2019

(51) Int. Cl.
*H01L 21/265* (2006.01)
*H01L 21/324* (2006.01)
(Continued)

(52) U.S. Cl.
CPC ...... *H01L 29/66462* (2013.01); *H01L 21/266* (2013.01); *H01L 21/2654* (2013.01);
(Continued)

(58) Field of Classification Search
CPC .......... H01L 21/02694; H01L 21/0415; H01L 21/046; H01L 21/0465; H01L 21/047;
(Continued)

(56) References Cited

U.S. PATENT DOCUMENTS 3,756,862 A * 9/1973 Ahn ..................... H01J 37/3171
438/308
6,072,216 A * 6/2000 Williams .............. H01L 21/266
257/339

(Continued)

OTHER PUBLICATIONS

Myers et al., Interaction of defects and H in proton-irradiated GaN(Mg, H), 2005, J. Appl. Phys. 97, 093517, pp. 1-6.*

(Continued)

*Primary Examiner* — Natalia A Gondarenko
(74) *Attorney, Agent, or Firm* — Abel Schillinger, LLP

(57) ABSTRACT

An electronic device including a transistor structure, and a process of forming the electronic device can include providing a workpiece including a substrate, a first layer, and a channel layer including a compound semiconductor material; and implanting a species into the workpiece such that the projected range extends at least into the channel and first layers, and the implant is performed into an area corresponding to at least a source region of the transistor structure. In an embodiment, the area corresponds to substantially all area occupied by the transistor structure. In another embodiment, the implant can form crystal defects within layers between the substrate and source, gate, and drain electrodes. The crystal defects may allow resistive coupling between the substrate and the channel structure within the transistor structure. The resistive coupling allows for better dynamic on-state resistance and potentially other electrical properties.

20 Claims, 9 Drawing Sheets

(51) Int. Cl.
*H01L 29/20* (2006.01)
*H01L 29/66* (2006.01)
*H01L 29/32* (2006.01)
*H01L 29/778* (2006.01)
*H01L 21/266* (2006.01)
*H01L 29/40* (2006.01)

(52) U.S. Cl.
CPC .......... *H01L 21/3245* (2013.01); *H01L 29/32* (2013.01); *H01L 29/404* (2013.01); *H01L 29/7786* (2013.01); *H01L 29/7787* (2013.01); *H01L 29/2003* (2013.01)

(58) Field of Classification Search
CPC .............. H01L 21/2056; H01L 21/2215; H01L 21/2252; H01L 21/2253; H01L 21/265; H01L 21/266; H01L 21/26553; H01L 21/26586; H01L 21/28044; H01L 21/28061; H01L 21/28079; H01L 21/28088; H01L 21/31155; H01L 21/3245; H01L 21/2654; H01L 21/47576; H01L 21/4763; H01L 21/7682; H01L 21/76859; H01L 21/823814; H01L 21/82385; H01L 29/32; H01L 29/2003; H01L 29/66462; H01L 29/7787; H01L 29/78621; H01L 29/41725–41791; H01L 29/66575–66598; H01L 2029/7863; H01L 21/3006; H01L 29/0653; H01L 29/66522; H01L 29/78681; H01L 29/7786; H01L 29/7788; H01L 29/4236; H01L 29/41775
USPC ....... 438/327, 172, 445, 515, 471, 308, 349, 438/358, 378, 394, 912, 798; 257/194, 257/631, 615, 76, 256, 288, E29.246, 257/E29.255, E29.312
See application file for complete search history.

(56) References Cited

U.S. PATENT DOCUMENTS

| | | | | |
|---|---|---|---|---|
| 8,178,951 | B2* | 5/2012 | Yoo ........................ | C30B 31/20 257/615 |
| 2006/0054929 | A1* | 3/2006 | Nakayama .......... | H01L 29/7783 257/197 |
| 2007/0184600 | A1* | 8/2007 | Zhang ............. | H01L 21/823807 438/199 |
| 2009/0218599 | A1* | 9/2009 | Mishra .............. | H01L 29/66462 257/194 |
| 2009/0230513 | A1 | 9/2009 | Yoo et al. | |
| 2014/0264449 | A1* | 9/2014 | Parsey, Jr. ........... | H01L 21/7624 257/194 |
| 2015/0228446 | A1* | 8/2015 | Breymesser ........ | H01L 29/0638 257/147 |
| 2015/0236122 | A1 | 8/2015 | Ren et al. | |
| 2016/0056145 | A1* | 2/2016 | Nagumo ........... | H01L 29/66462 257/76 |
| 2017/0186880 | A1* | 6/2017 | Nakayama .......... | H01L 21/3006 |
| 2017/0294538 | A1* | 10/2017 | Nakayama .......... | H01L 29/7783 |

OTHER PUBLICATIONS

Heterojunction; Wikipedia; obtained from archive.org; online date Jul. 21, 2017; pp. 1 to 6.
"Projected Range Statistics"; INNOViON Corp.; 2016; pp. 1 to 12.

* cited by examiner

PROCESS OF FORMING AN ELECTRONIC DEVICE INCLUDING A TRANSISTOR STRUCTURE

FIELD OF THE DISCLOSURE

The present disclosure relates to electronic devices including transistor structures, and more particularly to, processes of forming electronic devices including transistor structures.

RELATED ART

High electron mobility transistors (HEMTs) can be used for high power applications. A problem with HEMTs is that they can suffer from current collapse, carrier trapping, and the like. Improved performance, including improved dynamic on-state resistance, is undesired.

BRIEF DESCRIPTION OF THE DRAWINGS

Embodiments are illustrated by way of example and are not limited in the accompanying figures.

FIG. 11 includes simulation plots of on-state drain current versus off-state drain bias voltage 1 microsecond after corresponding transistor structures are turned on.

Figure 1:
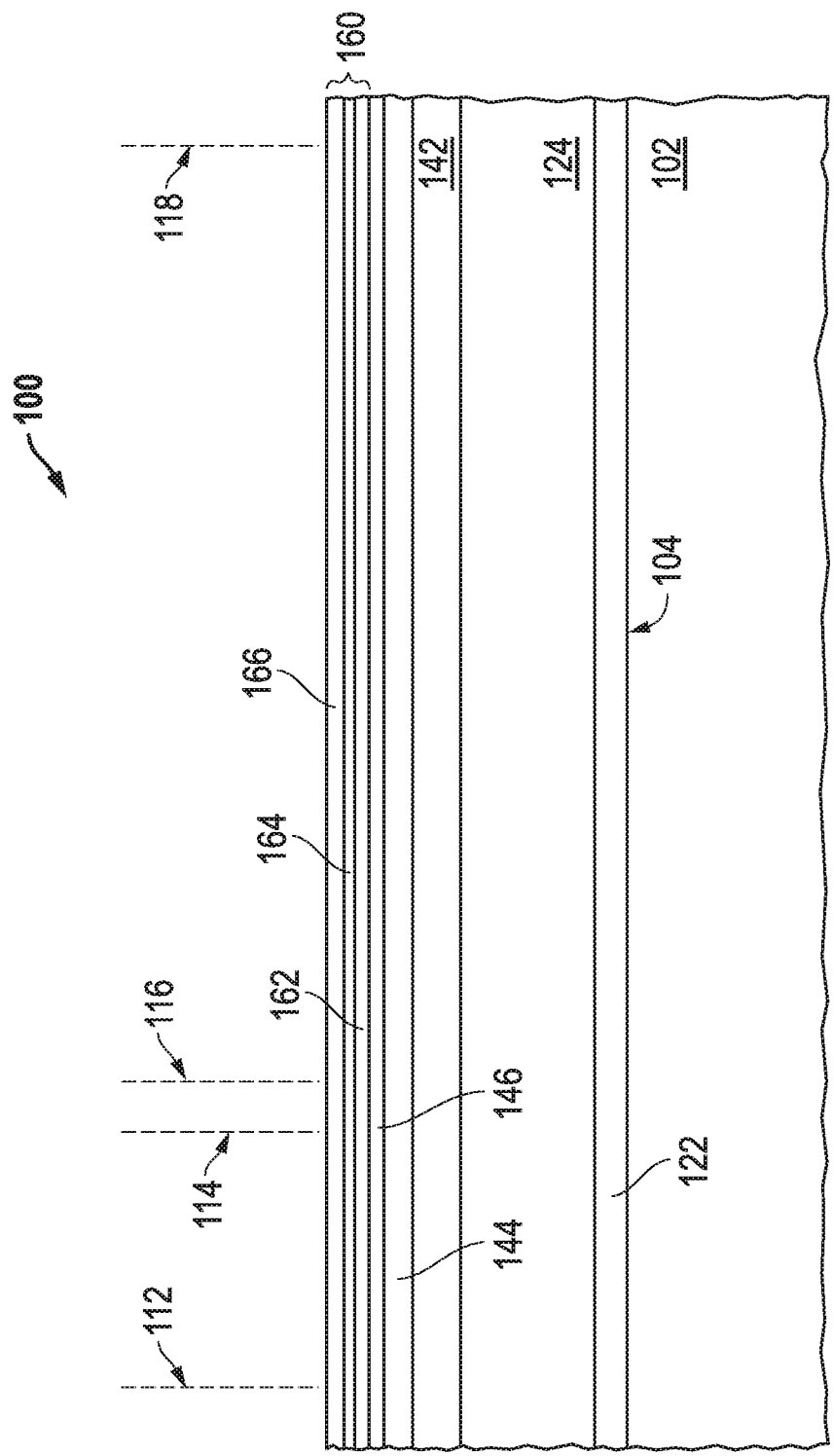
FIG. 1 includes an illustration of a cross-sectional view of a portion of a workpiece including a substrate, a nucleation layer, a stress relief layer, an intermediate layer, a channel layer, and an insulating layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" intended to mean a semiconductor material that includes at least two different elements. Examples include SiC, SiGe, GaN, InP, $Al_aGa_{(1-a)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element. A II-VI semiconductor material is intended to mean a semiconductor material that includes at least one divalent metal element and at least one Group 16 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types. Not all impurities are acceptors or donors. For example, hydrogen or any of the Group 18 elements (He, Ne, Ar, etc.) can be introduced into a semiconductor material as an impurity that is not an acceptor or a donor.

The term "semiconductor composition" is intended to refer to the composition of a layer that provides the semiconductor characteristics to the layer and does not include dopants. For example, an n-type doped silicon layer and a p-type doped silicon layer have the same semiconductor composition, namely silicon. However, an n-type doped silicon layer and an n-type doped GaN layer have different semiconductor compositions, as silicon and GaN provide the semiconductor characteristics and are different from each other.

Group numbers corresponding to columns within the Periodic Table of Elements based on the IUPAC Periodic Table of Elements, version dated Nov. 28, 2016.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for implant doses or impurity doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor structure. A process of forming the electronic device can include providing a workpiece including a substrate, a first layer, and a channel layer including a compound semiconductor material. In an embodiment, the first layer can be any of a nucleation layer, a stress relief layer, an intermediate layer, or any combination thereof. The process can also include implanting a species into the workpiece such that the projected range extends at least into the channel and first layers, and the implant is performed into an area corresponding to at least a source region of the transistor structure. In an embodiment, the area corresponds to all or substantially all of the area occupied of the transistor structure.

The process is well suited for a high mobility electron transistor (HEMT). In particular an unintentionally or very lightly doped channel layer may be capacitively coupled to a substrate and to the transistor terminals. The implant can help to create crystal defects in the channel and underlying layers that allow all of the channel layer within the transistor structure to be resistively coupled to the substrate and to the transistor terminals. The resistive coupling helps to prevent or substantially reduce the amount of charge accumulation that may occur within the channel region when in the off-state, particularly after the transistor structure has reached steady state. When the transistor structure is turned on after being at steady state in the off-state, the drain current quickly reaches steady state significantly faster than if the same transistor structure was not implanted or if only portions, and not substantially all, of the channel layer is implanted. Thus, dynamic on-state resistance is significantly improved.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

FIG. 1 includes an illustration of a cross-sectional view of a portion of a workpiece that includes a substrate 102, a nucleation layer 122, a stress relief layer 124, an intermediate layer 142, a channel layer 144, a barrier layer 146, a gate dielectric layer 162, an etch-stop layer 164, and a passivation layer 166. The workpiece includes regions as illustrated with the dashed lines 112, 114, 116, and 118. A source region, which includes and is to the left of the dashed line 112, is where a source electrode will be formed, a gate region, which includes and is between the dashed lines 114 and 116, is where a gate electrode will be formed, and a drain region, which includes and is to the right of the dashed line 118, is where a drain electrode will be formed. The significance of such regions and other regions between such regions will become more apparent with respect to an ion implantation operation described later in this specification.

The substrate 102 has a primary surface 104 and can include silicon, GaN, diamond, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface 104 can be selected depending upon the composition of the stress relief layer 124 that is subsequently formed over the substrate 102. The nucleation layer 122 can help to epitaxially grow subsequent layers. In an embodiment, the nucleation layer 122 may include one or more elements that are common to the subsequently formed stress relief layer 124. In a particular embodiment, the nucleation layer 122 can include aluminum nitride when an aluminum-containing stress relief layer 124 is formed over the nucleation layer 122. The thickness of the nucleating layer can be in a range of 20 nm to 1000 nm.

The stress relief layer 124 can include a plurality of films. The composition of the films may depend on the voltage at which the electronic device operates, the composition of the channel layer 144, or both. The overall thickness of the stress relief layer 124 can be in a range of 0.1 micron to 100 microns. In a particular embodiment, the overall thickness is in a range of 1 micron to 10 microns. As the operating voltage increases, the complexity and overall thickness of the stress relief layer 124 can increase. In an embodiment, the stress relief layer 124 includes $Al_{(1-w)}Ga_{(w)}N$, where $0 \leq w \leq 1$, when the channel layer includes GaN. In a particular embodiment, the content of Al decreases and the content of Ga content increases as the distance from the nucleation layer 122 increases. In another embodiment, the channel layer 144 may include a material other than GaN. The composition and number of films for the stress relief layer 124 can be tailored for a transistor structure that has a channel layer 144 that includes another compound semiconductor other than GaN.

The composition and thickness of the layers 142 and 146 may depend on the composition of the channel layer 144. The channel layer 144 will be described followed by the intermediate layer 142 and barrier layer 146. While some details are specific for a GaN channel layer 144, after reading the specification, skilled artisans will be able to make modifications that meet their needs or desires, even if the composition of the channel layer 144 is not GaN.

The channel layer 144 includes a compound semiconductor material, such as a III-V semiconductor material or a II-VI semiconductor material. In an embodiment, the channel layer 144 includes a III-V semiconductor material. In another embodiment, the semiconductor material includes a single Group 13 element, or in another embodiment, includes at least two different Group 13 elements. In a particular embodiment, the semiconductor material is $Al_{(1-u)}Ga_{(u)}N$, wherein $0<u\le1$, and in a more particular embodiment, u=1 (the semiconductor material is GaN).

The carrier impurities can be carrier traps within the channel layer 144 or the intermediate layer 142, and may be acceptors or donors. A high density two dimensional electron gas (2DEG) can be formed near the interface of barrier layer 146 and the channel layer 144, and is responsible for high mobility and lower resistivity of the transistor structure when in the on-state. Any reduction of the 2DEG electrons will increase the on-resistance of the transistor. In an embodiment, the acceptors can trap the electrons in the intermediate layer 142 due to high electric fields from the gate edge, field plate edges, and drain edge under off-state condition. Thus, the concentration of acceptors (when the carriers are electrons) or donors (when the carriers are holes) may be kept as low as reasonably possible. In a particular embodiment, acceptors can include carbon from a source gas when metalorganic chemical vapor deposition (MOCVD) is used to form the channel layer 144. Some carbon can become incorporated as the channel layer 144 is grown, although, such carbon in unintentional doping. The carbon content may be controlled by controlling the deposition conditions, such as the deposition temperature and flow rates.

In an embodiment, the channel layer 144 has a carrier impurity concentration that is greater than 0 and less than $1\times10^{14}$ atoms/cm$^3$, less than $1\times1015$ atoms/cm$^3$, or at less than $1\times10^{16}$ atoms/cm$^3$, and in another embodiment, at most $5\times10^{16}$ atoms/cm$^3$. In a further embodiment, the carrier impurity concentration is in a range of $1\times10^{13}$ atoms/cm$^3$ to $5\times10^{16}$. The impurity can be carbon from a source gas (e.g., $Ga(CH_3)_3$). In a particular embodiment, the lowest trap concentration is desired but may be limited by growth or deposition conditions and purity of the precursors.

In an embodiment, the channel layer 144 has a thickness that is at least 50 nm, at least 110 nm, or at least 200 nm. When the thickness is less than 50 nm, a 2DEG may be more difficult to generate, maintain, or both. In another embodiment, the channel layer 144 has a thickness that is at most 5000 nm, at most 2000 nm, at most 900 nm, at most 550 nm, or at most 300 nm. In a particular embodiment, the effectiveness of the intermediate layer 142 to confine carriers may be reduced as the thickness of the channel layer is greater than 550 nm. In a further embodiment, the channel layer 144 has a thickness is in a range of 20 nm to 2000 nm, 50 nm to 550 nm, or 110 nm to 300 nm. In a particular embodiment, the thickness in a range of 110 nm to 300 nm can provide a sufficiently thick channel layer 144 to allow for the proper generation and maintaining of the 2DEG and still obtain a reasonable static $R_{DSON}$.

In the embodiment as illustrated, the intermediate layer 142 underlies and directly contacts the channel layer 144. The intermediate layer 142 can have the same or a different composition as compared to the channel layer 144. For example, the different compositions may include at least one different element, different content levels of one or more elements, or both. The intermediate layer 142 can include a semiconductor material, such as a III-V semiconductor material or a II-VI semiconductor material. The bandgap energy, the carrier impurity concentration, or both of the intermediate layer 142 can be selected to help keep carriers confined within the channel layer 144 during the on-state.

In an embodiment, the intermediate layer 142 can include a III-V semiconductor material having at least two different Group 13 elements. In a particular embodiment, the intermediate layer 142 includes $Al_{(1-x)}Ga_xN$, where $0<x\le1$. When x=1, the semiconductor material includes GaN. In an embodiment, x is at least 0.50, at least 0.80, at least 0.90, or at least 0.99. In a particular embodiment, the intermediate layer 142 and the channel layer 144 can have the same semiconductor composition.

The intermediate layer 142 can have a higher carrier impurity concentration as compared to the channel layer 144. In an embodiment, the intermediate layer 142 has a carrier impurity at a concentration of at least $1\times10^{16}$ atoms/cm$^3$, at least $1\times10^{18}$ atoms/cm$^3$, or at least $1\times10^{19}$ atoms/cm$^3$, and in another embodiment, the intermediate layer 142 has a carrier impurity at a concentration of at most $1\times10^{21}$ atoms/cm$^3$. The stress relief layer 124, the nucleation layer 122, or both may have a carrier impurity concentration as described with respect to the intermediate layer 142. The intermediate layer 142, the stress relief layer 124, and the nucleation layer 122 may have the same or different carrier impurity concentrations as compared to one another.

The intermediate layer 142 can have a thickness that is the same, greater than, or less than the thickness of the channel layer 144. In an embodiment, the intermediate layer 142 has a thickness that is at least 50 nm, at least 110 nm, or at least 200 nm, and in another embodiment, the intermediate layer 142 has a thickness that is at most 1500 nm, at most 1000 nm, or at most 600 nm. In a further embodiment, the intermediate layer 142 has a thickness is in a range of 50 nm to 1500 nm, 110 nm to 1000 nm, or 200 nm to 600 nm. In a particular embodiment, a thickness in a range of 200 nm to 600 nm allows a sufficient thickness to accumulate sufficient charge and still be thin enough to have sufficient charge to repel carriers within the channel layer 144, so that carriers remain in the channel layer 144 when the transistor structure is in the on-state, which in turns helps with the generation and maintaining of the 2DEG.

Turning to the opposite side of the channel layer 144, the barrier layer 146 can overlie and directly contact the channel layer 144, such as in the embodiment as illustrated in FIG. 1. The barrier layer 146 can include a III-V semiconductor material or a II-VI semiconductor material. In an embodiment, the barrier layer 146 includes at least two different Group 13 elements. The barrier layer 146 can have a single film or a plurality of films. In another embodiment, at least one of the films of the barrier layer 146 can include $In_{(1-a-b)}Al_aGa_bN$, where $0\le a\le1$ and $0\le b\le1$. When at the barrier film includes at least two films, each of the films can have a composition consistent with the chemical formula above; however, the relative amount of In, Al, and Ga may be different between the two films. In still another embodiment, atomic In (not part of a chemical compound) may be used. After reading this specification, skilled artisans will be able to determine the number and composition of films within the barrier layer 146 to meet the needs or desires for a particular application.

In an embodiment, the barrier layer 146 has a carrier impurity concentration that is at least $1\times10^{13}$ atoms/cm$^3$, at least $1\times10^{14}$ atoms/cm$^3$, at least $1\times10^{15}$ atoms/cm$^3$, or at least $5\times10^{15}$ atoms/cm$^3$, and in another embodiment, the carrier impurity concentration is at most $5 \times 10^{18}$ atoms/cm$^3$, at most $1 \times 10^{18}$ atoms/cm$^3$, at most $1 \times 10^{17}$ atoms/cm$^3$, or at most $5 \times 10^{16}$ atoms/cm$^3$. In a further embodiment, the carrier impurity concentration is in a range of $1 \times 10^{13}$ atoms/cm$^3$ to $5 \times 10^{18}$ atoms/cm$^3$, $1 \times 10^{14}$ atoms/cm$^3$ to $1 \times 10^{18}$ atoms/cm$^3$, $1 \times 10^{15}$ atoms/cm$^3$ to $1 \times 10^{17}$ atoms/cm$^3$, or $5 \times 10^{15}$ atoms/cm$^3$ to $5 \times 10^{16}$ atoms/cm$^3$. In an embodiment, the carrier impurity concentration in the barrier layer 146 can be selected to maintain the strain of the barrier layer 146 by acceptors, such as carbon, due to the higher cohesive energy of such an acceptor. In another embodiment, similar effects may be seen with other carrier impurities.

In an embodiment, the barrier layer 146 has a thickness that is at least 0.5 nm, at least 5 nm, at least 11 nm, or at least 20 nm, and in another embodiment, the barrier layer 146 has a thickness that is at most 200 nm, at most 150 nm, at most 90 nm, or at most 40 nm. In a further embodiment, the barrier layer 146 has a thickness is in a range of 0.5 nm to 200 nm, 5 nm to 40 nm.

The nucleation layer 122, the stress relief layer 124, the intermediate layer 142, and channel layer 144, the barrier layer 146, or any combination thereof can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like. In a particular embodiment, the intermediate layer 142 is epitaxially grown from the stress relief layer 124, the channel layer 144 is epitaxially grown from the intermediate layer 142, and the barrier layer 146 is epitaxially grown from the channel layer 144. The epitaxial growth can be performed as a chemical vapor deposition using an organometallic compound, a hydride, or a halide. In a particular embodiment, an alkyl compound may be used. For example, a gallium source may include Ga(C$_x$H$_{2x+1}$))$_3$, where x is 1 to 3. A nitrogen source can include NH$_3$ or N$_2$H$_4$. Carrier impurities, such as acceptors or donors, may be incorporated from one or more of the sources (for example, C from the Ga source gas) or may be separately added if needed or desired. When the channel layer 144 includes GaN, acceptors can include Be, C, Mg, Zn, Cd, or any combination thereof, and donors can include Si, Ge, or any combination thereof.

The insulating layer 160 can include a gate dielectric film 162, an intermediate film 164, and a capping film 166. In an embodiment, the gate dielectric film 162 can include a silicon nitride, an aluminum oxide, a zirconium oxide, a hafnium oxide, a niobium oxide, another suitable dielectric material, or any combination thereof and have a thickness in a range of 5 nm to 40 nm. The intermediate film 164 can act as an etch-stop layer when etching the capping film 166. In an embodiment, the intermediate film 164 can include AlN and have a thickness in a range of 2 nm to 20 nm. The capping film 166 can help to protect the gate dielectric film 162. In an embodiment, the capping film 166 can include silicon nitride and have a thickness in a range of 20 nm to 500 nm. In another embodiment, the insulating layer 160 can include fewer or more films that may have the same or different compositions as described. When the intermediate film 164 includes AlN, an optional Al$_2$O$_3$ film (not illustrated) can be formed by oxidizing a portion of the intermediate film 164 in an oxidizing ambient, such as O$_2$, N$_2$O, or the like. The insulating layer 160 or any films of the insulating layer 160 can be formed using a chemical or physical vapor technique.

In an embodiment, all layers 122, 124, 142, 144, 146, and 160 can be formed during the same evacuation cycle. If needed or desired, vacuum can be broken between depositing any one or more of the layers. After reading this specification, skilled artisans will be able to determine particular details in forming the layers to meet the needs or desires for a particular application.

Figure 2:
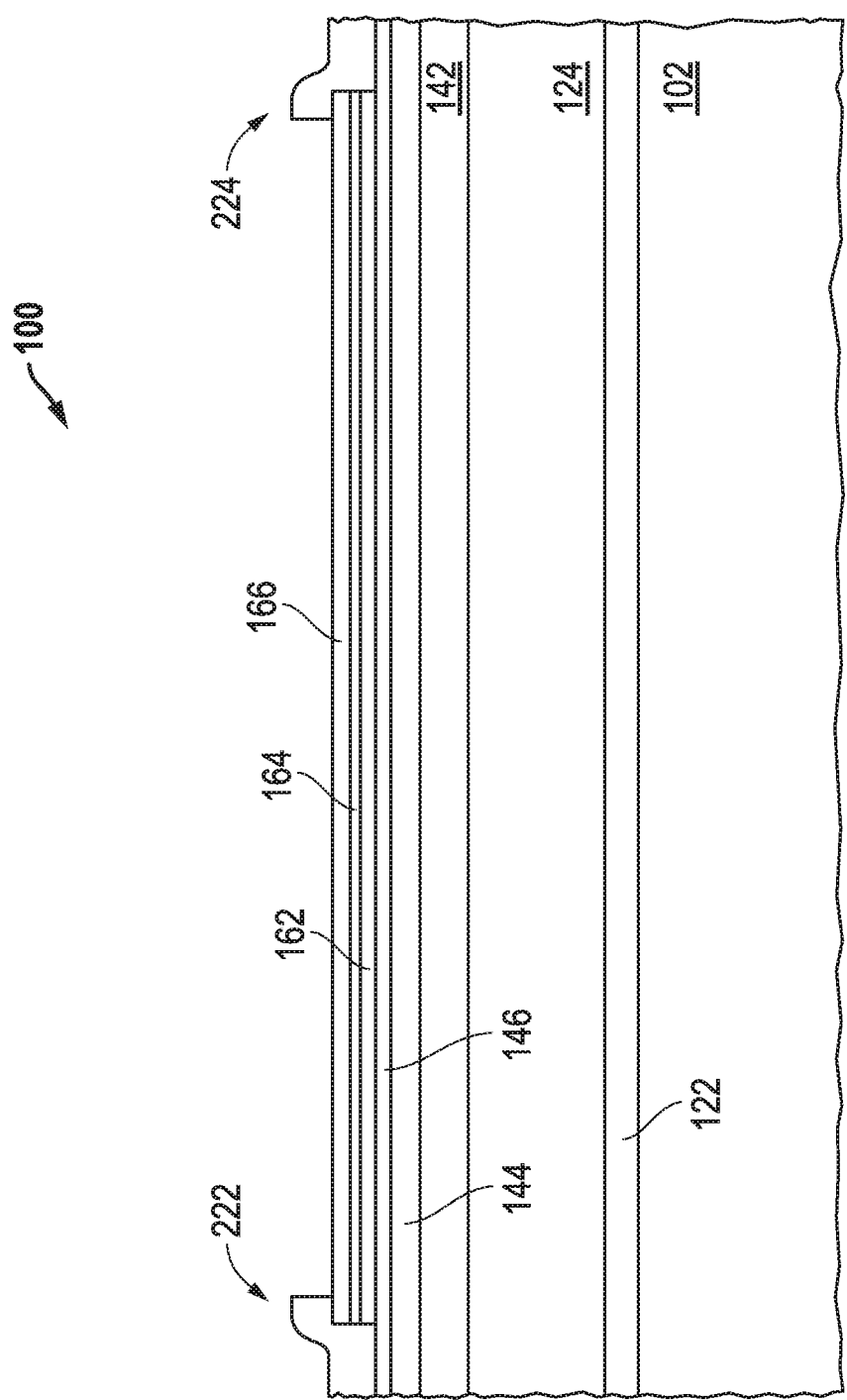
FIG. 2 includes an illustration of a cross-sectional view of the workpiece of FIG. 1 after patterning the insulating layer and forming source and drain electrodes.

FIG. 2 includes an illustration of the workpiece 100 after forming a source electrode 222 and a drain electrode 224. The insulating layer 160 is patterned to define contact openings exposing the barrier layer 146. A conductive layer is deposited over the workpiece 100, including within the contact openings. The conductive layer has a composition selected to provide a proper work function for the transistor being formed. The conductive layer can include Ti, TiN, Al, Pd, Pt, W, Au, Ni, or a stack or any combination thereof. In another embodiment, the conductive layer is typically at least 50 wt % aluminum, copper, a noble metal, or an alloy of any of the foregoing. The conductive layer has a thickness in a range of 50 nm to 500 nm. The conductive layer is patterned to form the source electrode 222 and the drain electrode 224.

Figure 3:
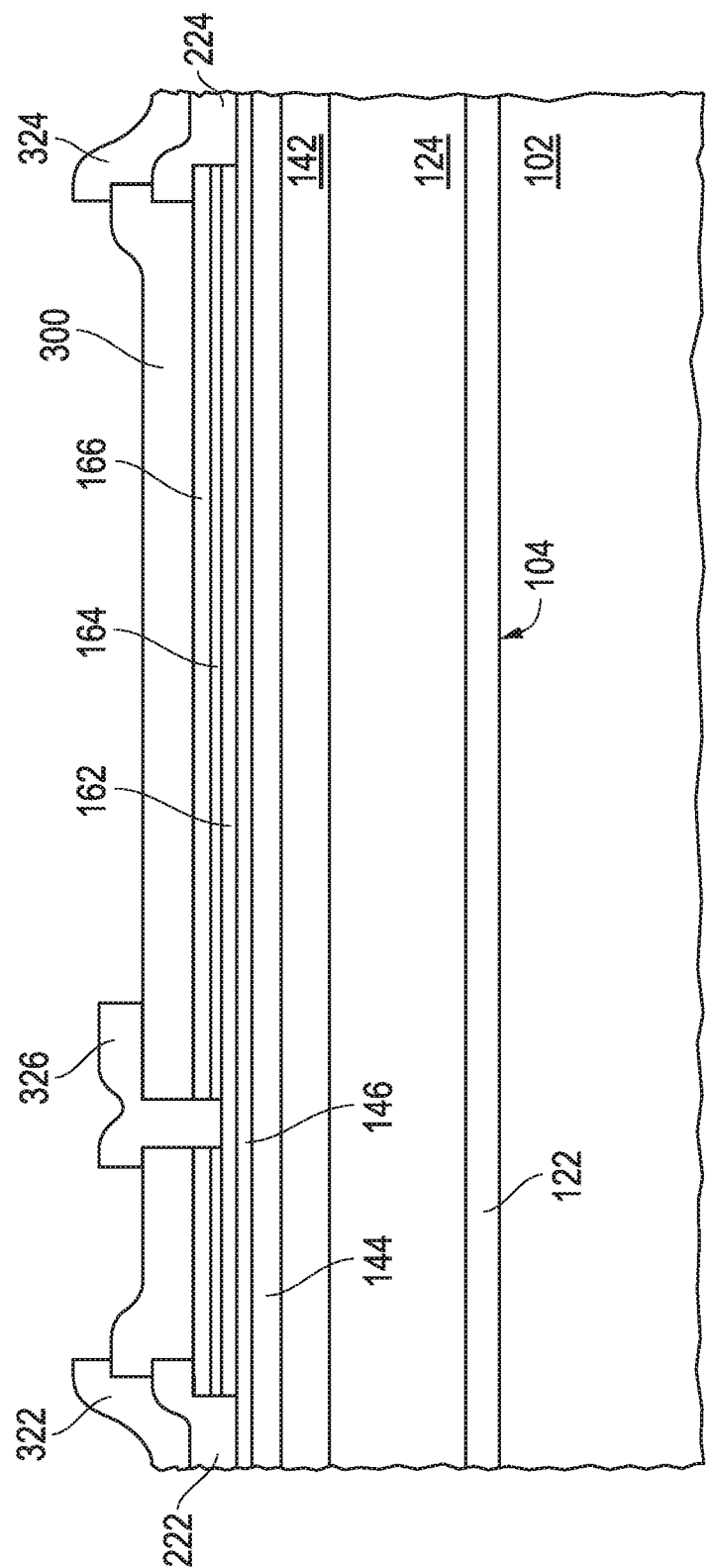
FIG. 3 includes an illustration of a cross-sectional view of the workpiece of FIG. 2 after forming an interlevel dielectric layer, patterning the interlevel dielectric layer and films within the insulating layer, and forming source and drain interconnects and a gate electrode.

FIG. 3 includes an illustration of the workpiece 100 after forming an interlevel dielectric (ILD) layer 300, a source interconnect 322, a drain interconnect 324, and a gate electrode 326. The ILD layer 300 can include an oxide, a nitride, an oxynitride, or any combination thereof. The ILD layer 300 can include a single film having a substantially constant or changing composition (e.g., a high phosphorus content further from the semiconductor layer 104) or a plurality of discrete films. An etch-stop film, an antireflective film, or a combination may be used within or over the ILD layer 300 to help with processing. The ILD layer 300 can be deposited to a thickness in a range of approximately 0.5 micron to approximately 2.0 microns. The ILD layer 300 is patterned to define openings where the source and drain interconnects 322 and 324 and the gate electrode 326 are subsequently formed. The capping film 166 and intermediate film 164 are patterned where the gate electrode will be formed. Thus, the source and drain electrodes 222 and 224 and a portion of the gate dielectric film 162 are exposed at this point in the process.

A conductive layer is deposited over the workpiece 100, including within the openings in the ILD layer 300 and the intermediate and capping films 164 and 166. The conductive layer has a composition selected to provide a proper work function for the transistor structure being formed. The conductive layer can have any of the compositions and thicknesses are previously described with respect to the conductive layer used to form the source and drain electrodes 222 and 224. The conductive layer at the current level may have the same or different compositions or the same or different thicknesses as compared to the conductive layer used for the source and drain electrodes 222 and 224. The conductive layer is patterned to form the source interconnect 322, the drain interconnect 324, and the gate electrode 326.

Figure 4:
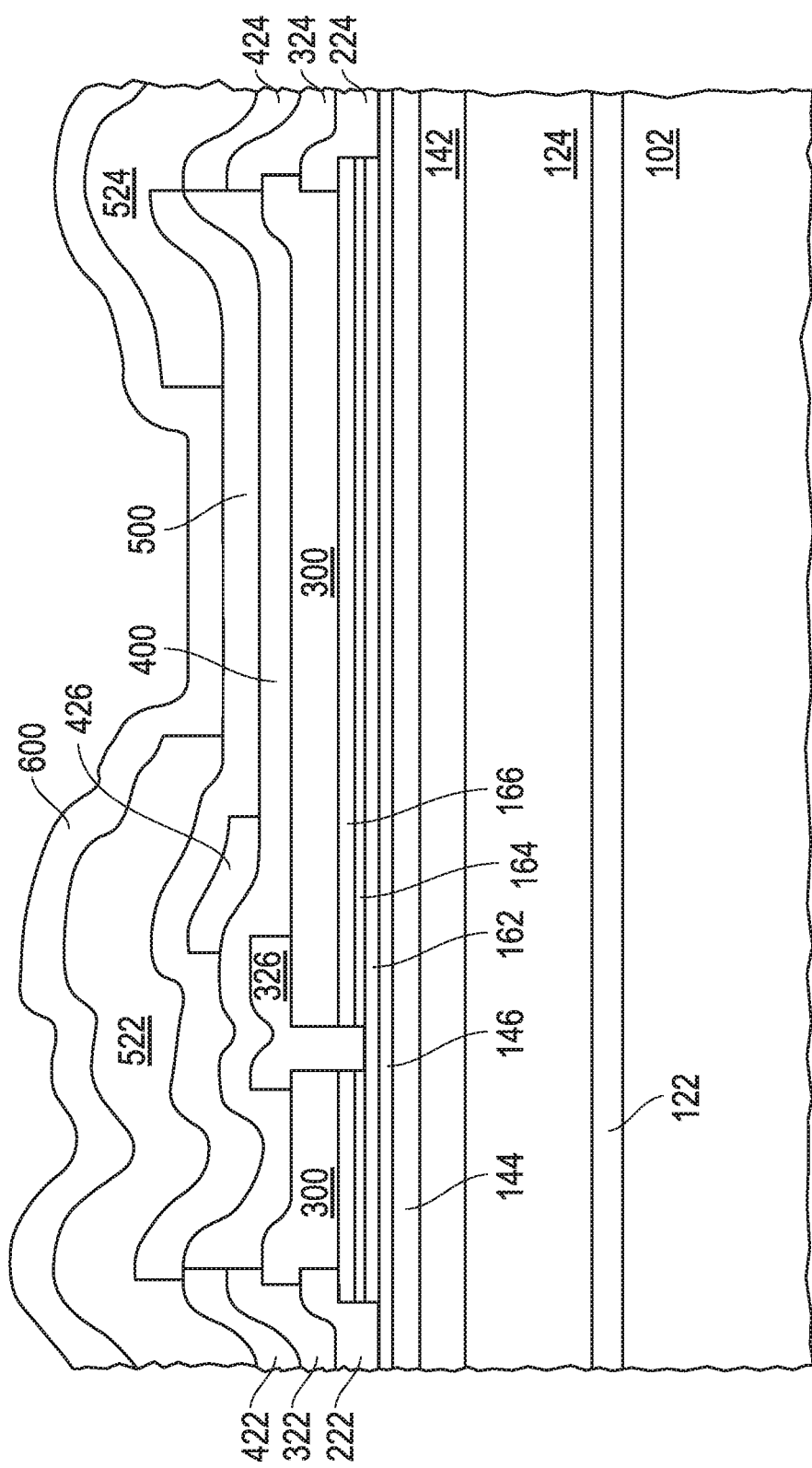
FIG. 4 includes an illustration of a cross-sectional view of the workpiece of FIG. 3 after forming and patterning layers for a transistor structure.

FIG. 4 includes an illustration of the workpiece after forming ILD layers 400 and 500, source and drain interconnects 422 and 424, source and drain terminals 522 and 524, and a passivation layer 600. The ILD layer 400 can be deposited and patterned, and source and drain interconnects 422 and 424 can be formed. A shielding portion 426 is part of the same conductive member as the source interconnect 422. An opening in the conductive layer for the source interconnect 422 is to reduce capacitive coupling between the source and gate of the transistor structure. The ILD layer 500 can be deposited and patterned, and source and drain terminals 522 and 524 can be formed. A portion of the source terminal 522 extending toward the drain terminal 524, and a portion of the drain terminal 524 extending toward the source terminal 522 help provide shielding for the transistor structure. The ILD layers 400 and 500 can have any of the compositions and thicknesses as previously described with respect to the ILD layer 300. The ILD layers 400 and 500 at the may have the same or different compositions or the same or different thicknesses as compared to each other and the ILD layer 300. The conductive layer for the interconnects 422 and 424 and terminals 522 and 524 can have any of the compositions and thicknesses are previously described with respect to the conductive layer used to form the source and drain electrodes 222 and 224. The conductive layer for the interconnects 422 and 424 and terminals 522 and 524 may have the same or different compositions or the same or different thicknesses as compared to the conductive layer used for the source and drain electrodes 222 and 224. In a particular embodiment, the thickness of the conductive layer for the terminals 522 and 524 can be thicker than the conductive layers used to form the electrodes 222, 224, 326 and interconnects 422 and 424.

The passivation layer 600 is formed over the ILD layer 500 and the terminals 522 and 524. The passivation layer 600 can include any of the materials a previously described with respect to the ILD layer 200. In another embodiment, the passivation layer 600 can include polyimide or a photoimageable polymer.

Figure 5:
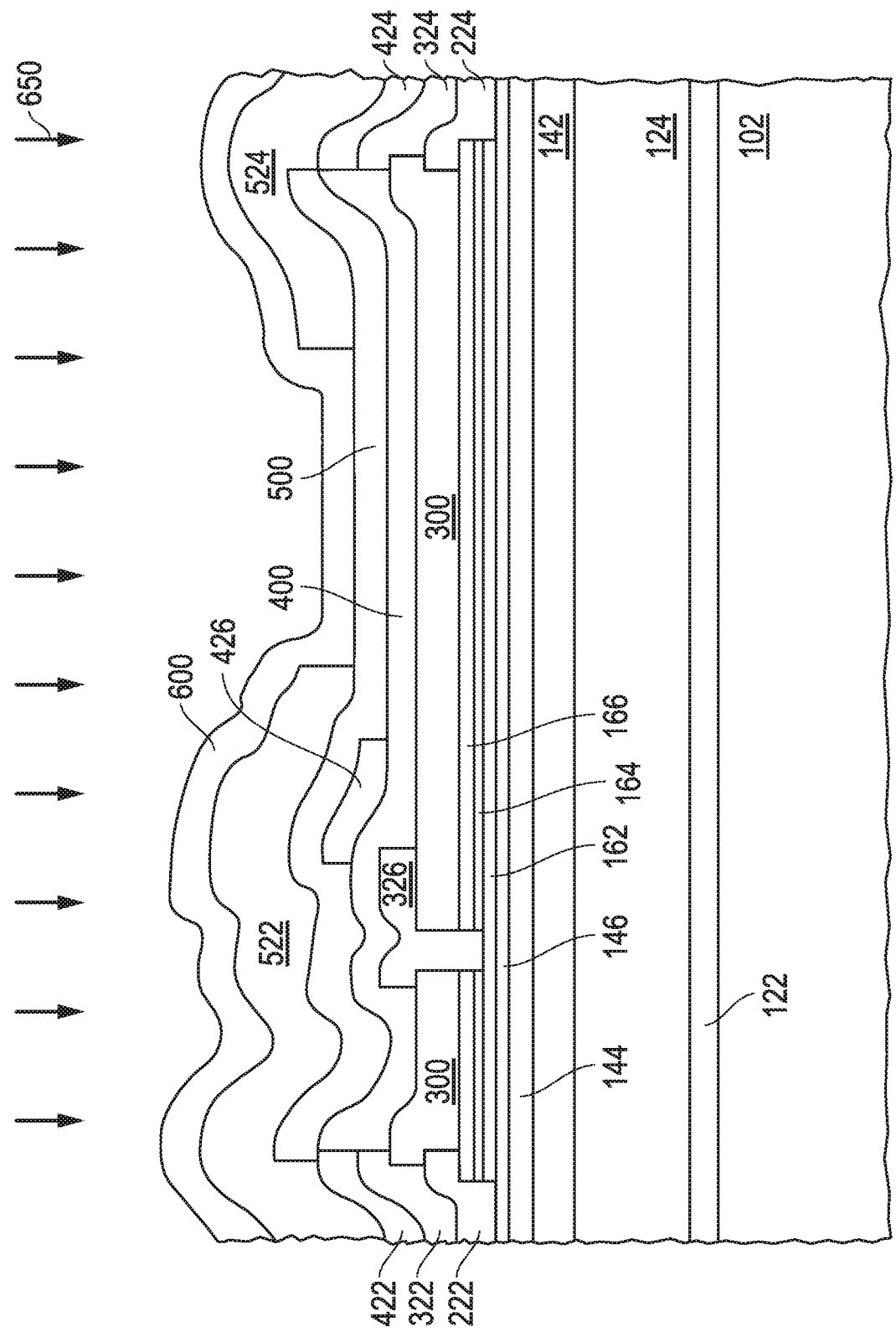
FIG. 5 includes an illustration of a cross-sectional view of the workpiece of FIG. 4 during an ion implantation operation.

The transistor structure as illustrated in FIGS. 4 and 5 is a depletion mode transistor. In another embodiment, a different type of gate structure may be used. For example, the gate dielectric film 162, the intermediate film 164, or both may be omitted. A gate electrode may be formed that contacts the barrier layer 146. In a further embodiment, the transistor structure can be an enhancement-mode transistor. In a particular embodiment, a p-type GaN layer may be used for a gate electrode, instead of a gate electrode that is a metal or a metal alloy. In another particular embodiment, another or a different gate dielectric film may be used in the insulating layer 160, and thus, the transistor structure can be a metal-insulator-semiconductor HEMT.

FIG. 5 includes an illustration of the workpiece 100 during ion implantation as illustrated with arrows 650. The implant can help to form a leakage path through the channel layer 144 to the substrate 102. In this embodiment, all of the transistor structure is exposed to the ion implant using relative light ions, such as $H^+$ or $He^+$ ions, wherein some of the ions may travel through the layers to reach the substrate 102. In a particular embodiment, the ion implantation can be performed as a blanket implant (no implant masking layer present) over all of the workpiece. In an embodiment, the ion implantation can be performed at an energy of at least 0.1 MeV, at least 0.4 MeV, or at least 1.1 MeV, and in another embodiment, the ion implantation may be performed at an energy of at most 5 MeV or at most 4 MeV. In a further embodiment, an energy higher or lower than the energies disclosed may be used, particularly when the number of layers and thicknesses of the layer differ from those illustrated in FIG. 6. Also, the energy may be different, as the energies previously described are tailored for $H^+$ ions. The same or different energies may be used when $He^+$ ions are used.

In an embodiment, the implant dose can be at least $1 \times 10^{11}$ ions/cm$^2$, at least $1 \times 10^{12}$ ions/cm$^2$, or at least $1 \times 10^{13}$ ions/cm$^2$, and in another embodiment, the dose can be at most $1 \times 10^{15}$ ions/cm$^2$ or at most $5 \times 10^{14}$ ions/cm$^2$. Significant improvement with device performance becomes more apparent when the implant dose is at least $1 \times 10^{13}$ ions/cm$^2$. When the implant dose is larger than $1 \times 10^{15}$ ions/cm$^2$, damage from the implant may be too great. A dose in a range of $1 \times 10^{14}$ ions/cm$^2$ to $5 \times 10^{14}$ ions/cm$^2$, such as $1.5 \times 10^{14}$ ions/cm$^2$, may provide good performance with a sufficiently low level of implant damage. The implant may be performed with a tilt angle in a range of 0° to 10°. More details regarding considerations with the tilt angle are described with respect to an alternative embodiment later in this specification.

Further processing may be performed to form a substantially finished electronic device. For example, the passivation layer 600 layer may be patterned to that wire bonds, clips, or other electrical connectors (not illustrated) can be made to the source terminal 522, the drain terminal 524, and a gate terminal (not illustrated) that is connected to the gate electrode 326.

The timing of the implant described with respect to FIG. 5 can be performed at another point in the process. For example, the implant may be performed after patterning the passivation layer 600 to expose portions of the source terminal 522, the drain terminal 524, and the gate terminal. In another embodiment, the implant may be performed at an earlier point in the process flow. For example, the implant may be performed after forming to the workpiece as illustrated in FIG. 3. The implant may be performed still earlier in the process, such at after forming the workpiece as illustrated in FIG. 1.

As the implant is performed earlier in the process, the implant channeling may be greater. The implant is to form crystal defects within the layers 122, 124, 142 and 144. Some implant channeling may be desired, particularly as the layer 124 becomes thicker. In another embodiment, implant channeling is to be reduced as much as reasonably possible, particularly, since the channel layer 144 is to be damaged by the implant. The tilt angle and wafer rotation at a particular tilt angle can affect the how much channeling occurs. The tilt angle can be in a range of 0° to 10°, where 0° is in a direction perpendicular to the primary surface 104. A crystal having a primary surface along a (100) crystal plane when expressed in Miller indices, such as (001) GaN, may have a tilt angle of 7° and a wafer rotation that is within 5° of an odd numbered integer of 22.5° from the <110> family of crystal directions. Other wafer tilts and wafer rotations may be used without deviation from the concepts as described herein. Referring to FIGS. 3 and 5, the likelihood of implant channeling is significantly reduced by the presence of at least the ILD layer 300, source and drain electrodes 222 and 224, the gate electrode 326, and the source and drain interconnects 322 and 324. After reading this specification, skilled artisans will be able to determine the point in the process in which the implant is to be performed and what wafer tilt and wafer rotation to be used depending in whether implant channeling is desired or is to be reduced.

Figure 6:
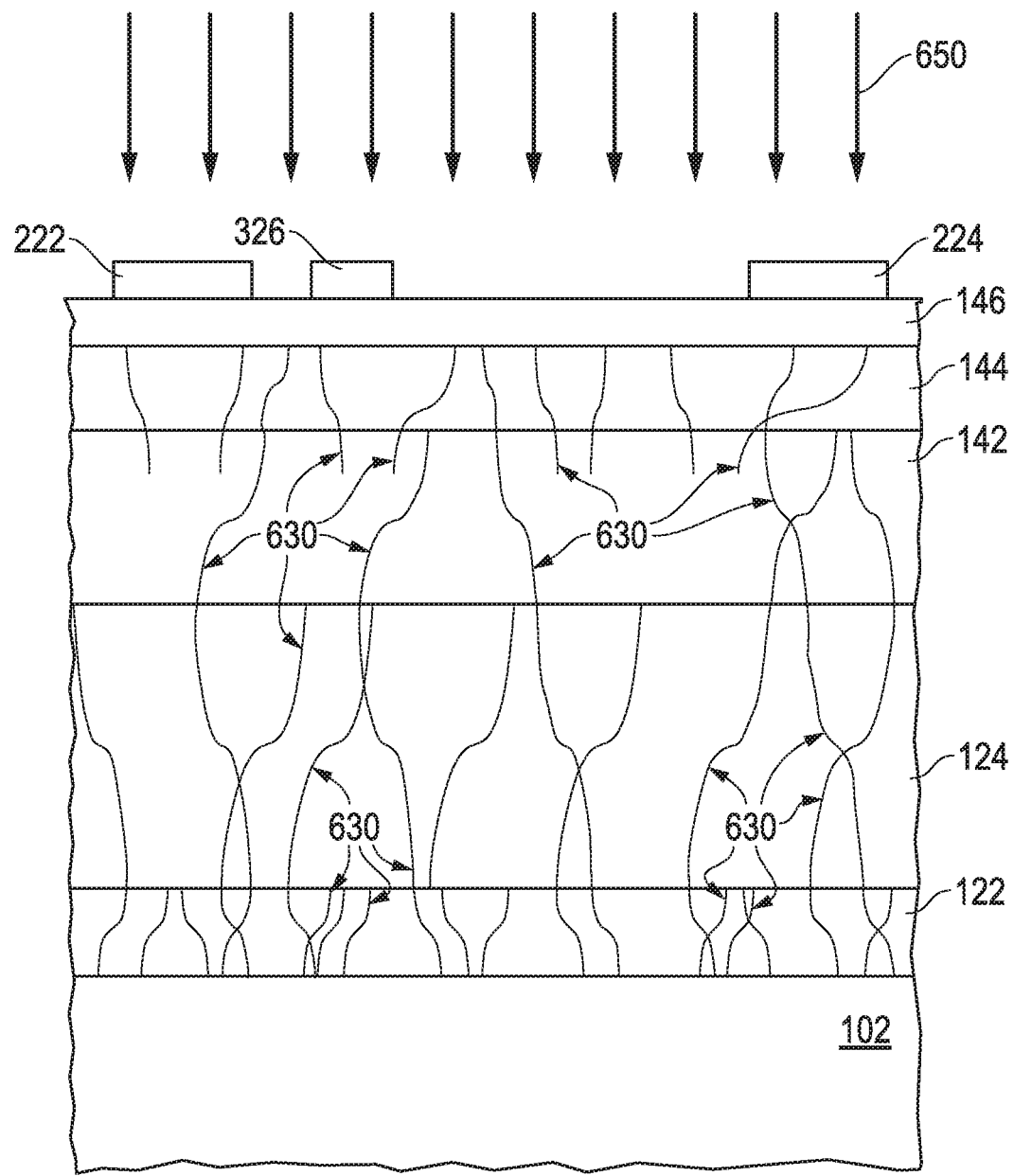
FIG. 6 includes a simplified depiction of the workpiece of FIG. 5 illustrating crystal defects formed within layers between the substrate and the source, gate, and drain electrodes.

FIG. 6 is a simplified illustration of the workpiece 100 from FIG. 5 depicting implant damage in the form of crystal defects 630 within layers 122, 124, 142, and 144 that can be caused by the ion implant as previously described. The ion implant allows leakage paths to be formed between the substrate 102 and each of the source electrode 222, the gate electrode 326, and the drain electrode 224 and regions between the electrodes. Thus, each of the source 222, gate 326, drain 224, and regions between such electrodes is resistively and capacitively coupled to the substrate 102. If the implant would not be performed, such as the transistor structure illustrated in FIG. 4 (before the ion implant), the source, gate, and drain electrodes 222, 326, and 224 are capacitively coupled, but not resistively coupled, to the substrate 102. The capacitive coupling is due to the interfaces between the layers, mostly heterojunctions. If the ion implant is masked from any portion of the transistor structure, such as the source electrode 222, such masked portion would not have any crystal defects. The source electrode 222 would not be resistively coupled to the substrate 102, and charge could accumulate when the transistor is in the off-state.

From an electrical perspective, the ion implant helps to form leakage paths that are in parallel to the capacitors (layer interfaces). Thus, charge accumulation, such as negative charge build up at the top of the intermediate layer 142, can be prevented or at least substantially reduced. The resistivity of the channel layer 144 remains sufficiently high, such as at least $1 \times 10^{10}$ ohm-cm. Although not intended to be bound by theory, the crystal defects 630 from the ion implant preferentially increase leakage current in a vertical direction without significantly increasing leakage current between the source electrode 222 and drain electrode 224.

Figure 7:
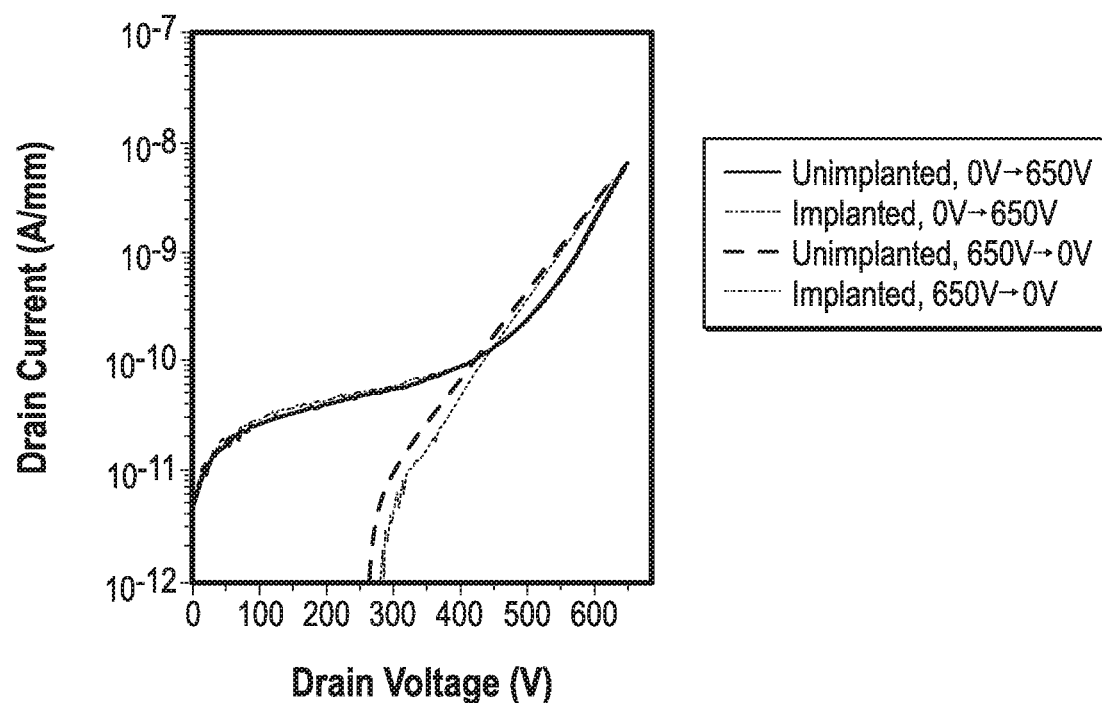
FIG. 7 includes plots of off-state drain current versus drain-to-source voltage when the transistor structure is an ion implanted at a dose of $1.5 \times 10^{13}$ ions/cm$^2$.
Figure 8:
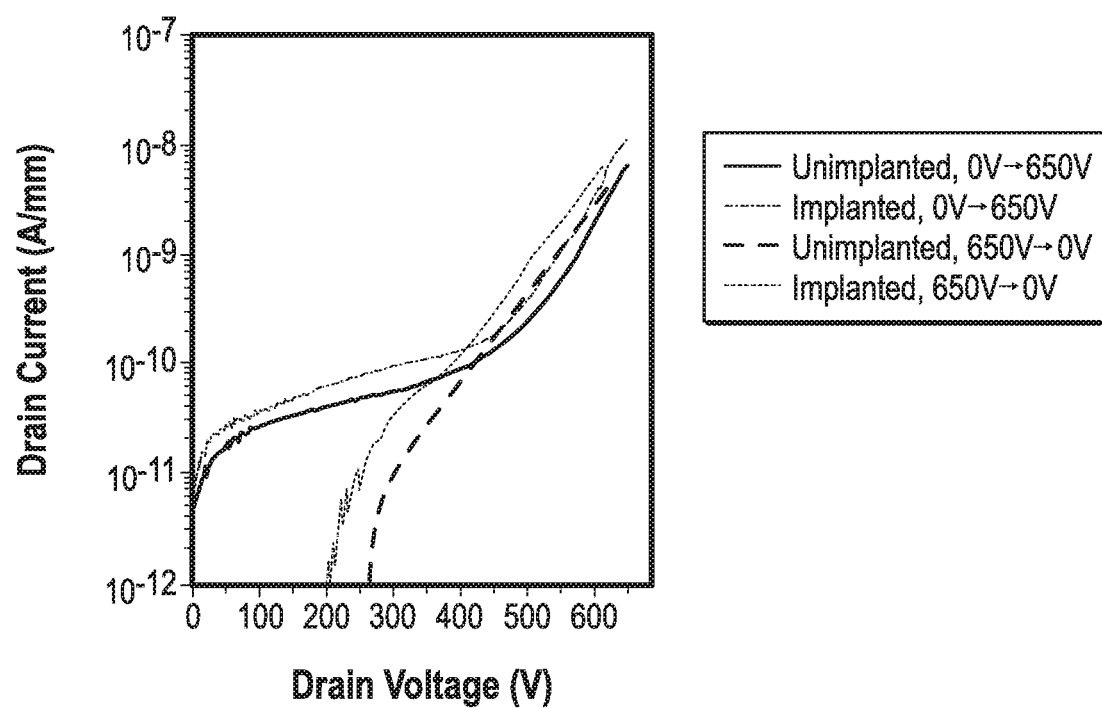
FIG. 8 includes plots of off-state drain current versus drain-to-source voltage when the transistor structure is an ion implanted at a dose of $1.5 \times 10^{14}$ ions/cm$^2$.

FIGS. 7 and 8 include plots of leakage current (measured at the drain) as a function of drain voltage (source, gate, and substrate at 0 V) for two different implant doses using $H^+$ ions. The transistor structures used correspond to the transistor structures illustrated in FIGS. 4 (no ion implant) and FIG. 5 (ion implant). While in the off-state, the transistor structures are increased from 0 V to 650 V and decreased from 650 V to 0 V.

FIG. 7 compares the leakage current for transistor structures, one having no implant and the other with a H+ implant at a dose of $1.5 \times 10^{13}$ ions/cm². The leakage current, measured as drain current as plotted in FIG. 7, is nearly the same for both transistor structures. FIG. 8 compares similar transistor structures except that one of the transistor structures had a H+ implant at a dose of $1.5 \times 10^{14}$ ions/cm². Referring to FIG. 8, the difference in leakage currents between the structures can be seen more readily. The implanted transistor structure has a higher leakage current as the drain bias voltage is increased from 0 V to 650 V and when decreased from 650 V to 0V. The leakage current for the implanted transistor structure is significantly less than an order of magnitude higher than unimplanted transistor structure. Thus, the transistor structure in FIG. 8 has higher leakage current; however, the higher leakage current is acceptable. As the implant dose increases, the leakage current is expected to increase. Thus, at an implant dose greater then $1 \times 10^{15}$ ions/cm², the leakage current may be too high. Accordingly, a dose that is higher than $1.5 \times 10^{13}$ ions/cm² may be used to help reduce charge accumulation more effectively and a dose of at most $1 \times 10^{15}$ ions/cm² can help keep the leakage current becoming too higher or causing another mechanical or electrical problem within the transistor structure.

Figure 9:
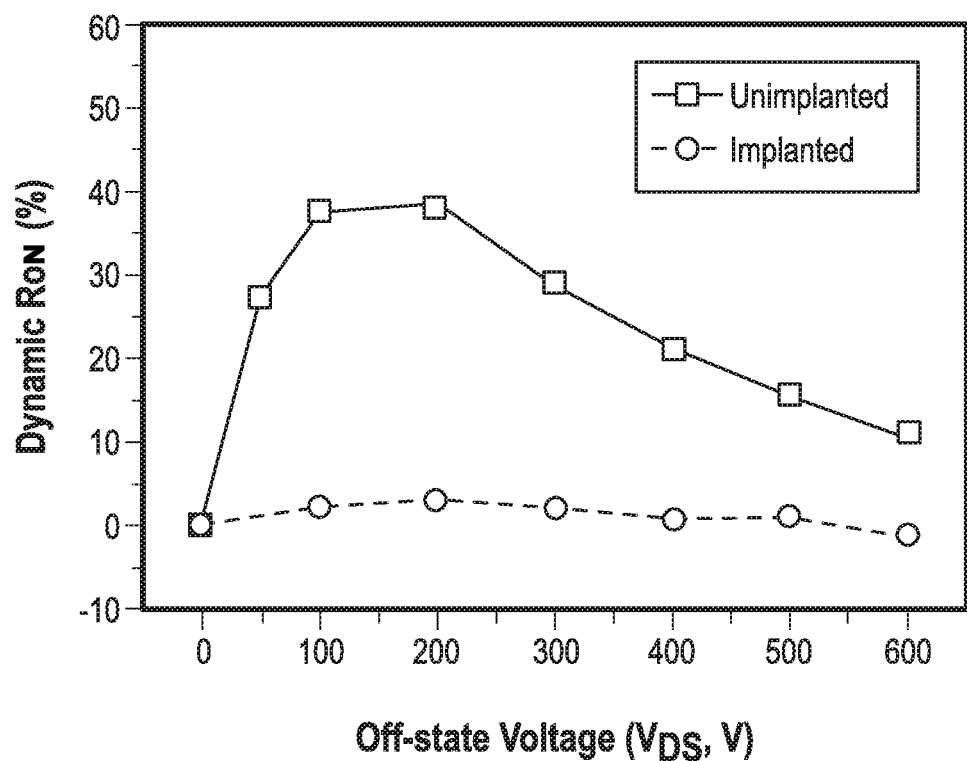
FIG. 9 includes plots of the dynamic on-resistance when the transistor structure is ion implanted at a dose of $1.5 \times 10^{14}$ ions/cm$^2$.

FIG. 9 includes an illustration of the effect of proton irradiation at a dose of $1.5 \times 10^{14}$/cm² on dynamic on-state resistance ($R_{ON}$) for a 650 V power transistor. The x-axis plots the quiescent drain voltage, at which the device is held for 20 ms in the off-state. Then, the device is switched back to the on-state, and its $R_{ON}$ is measured as fast as 20 µs. The measured $R_{ON}$ is normalized to the $R_{ON}$ at low drain voltage (typically 1 V). Without proton irradiation, the dynamic $R_{ON}$ shows a maximum of ~40% at around 100-200V (consistent with model "C", see FIG. 11). With proton irradiation at a dose of $1.5 \times 10^{14}$/cm², there is no dynamic $R_{ON}$, consistent with model "D" of FIG. 11.

Figure 10:
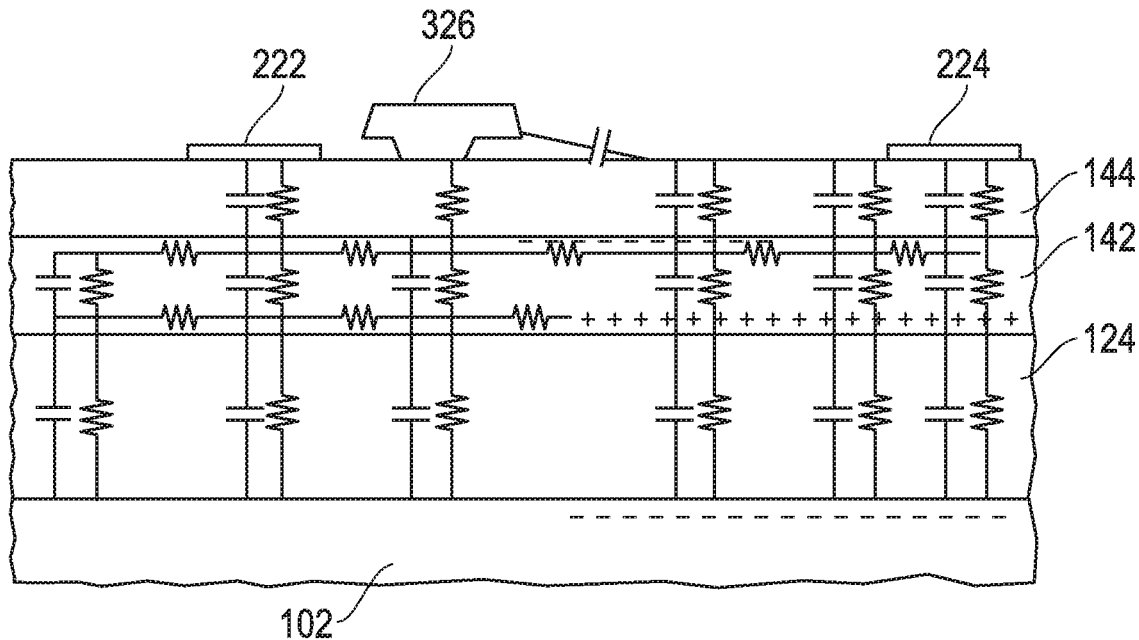
FIG. 10 includes an illustration of an electrical equivalent of the transistor structure used for simulation purposes.

FIG. 10 includes an illustration of an equivalent electrical circuit used for modeling performance of the transistor structure. The capacitors represent the interfaces between the layers and the gate-to-drain capacitance. The resistors oriented in the vertical direction represent leakage paths created by the ion implant. Simulations illustrate the improved performance related to dynamic on-state resistance ($R_{ON}$). The simulations include:

Model A—The structure of FIG. 4 without any trapping or ionization (idealized capacitor, does not occur in practice)

Model B—The structure of FIG. 4 when the intermediate layer 142 electrically floats (representing full current collapse).

Model C—The structure of FIG. 5, except the ion implant is only through the source electrode 222 and drain electrode 224 and nowhere between the source electrode 222 and drain electrode 224.

Model D—The structure of FIG. 5 (ion implant along all of the transistor structure consistent with the teachings above)

Figure 11:
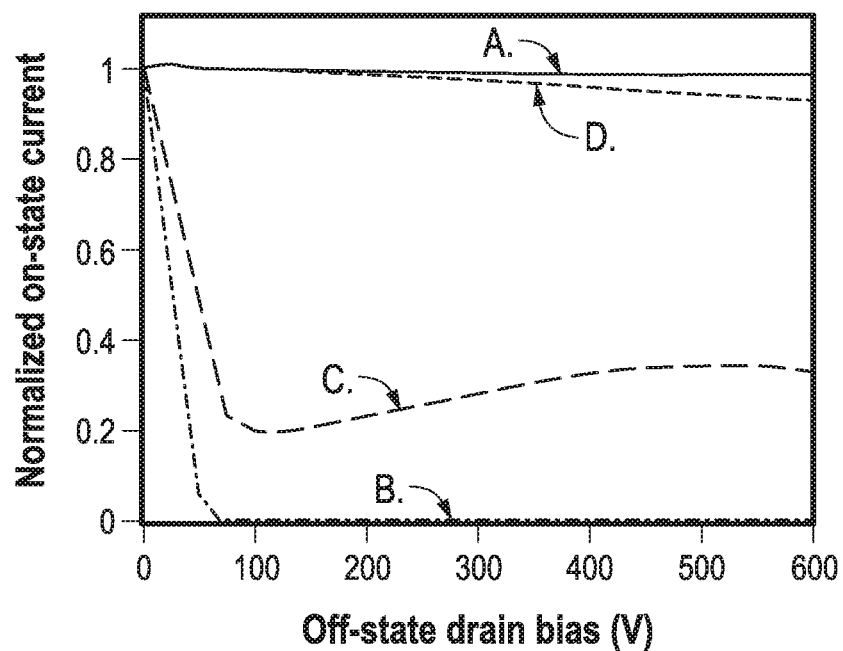
Figure 12:
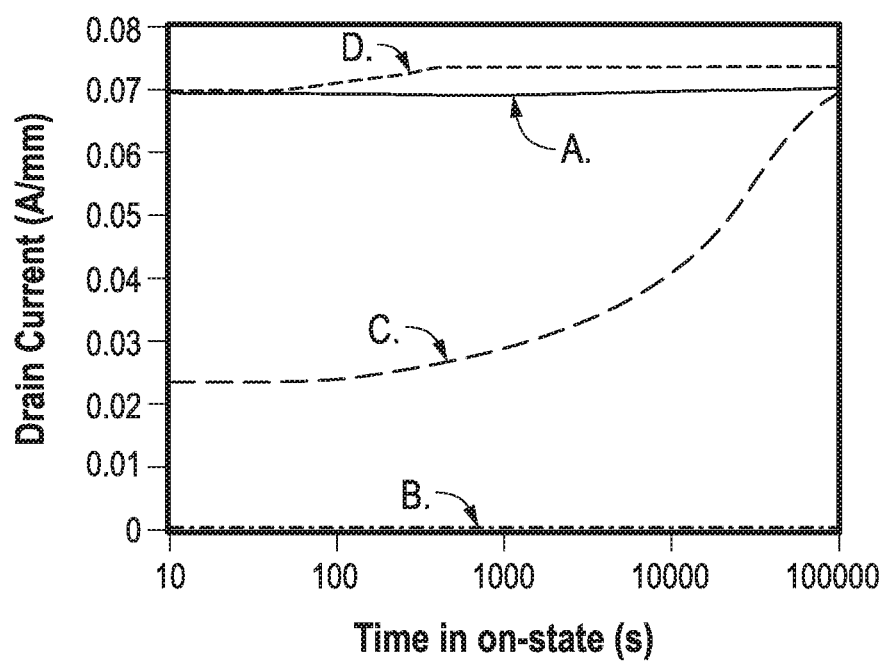
FIG. 12 includes simulation plots of on-state drain current versus time since turning on the corresponding transistor structures when such transistors were at stead state with an off-state drain bias of 400 V.

Transistor structures corresponding to Models A to D are at steady state conditions in the off-state before the transistor structures are turned on. FIGS. 11 and 12 illustrate drain current after the transistor structures are turned on.

FIG. 11 includes a plot of drain current as a function of drain voltage at 1 microsecond after the transistor structures are turned on. In FIG. 11, drain current is normalized to Model A, which is the idealized capacitor, which does not occur in practice. When the drain voltage is 100 V and higher, the differences between Models B to D are significant. Model B does not show any significant current as compared to Model A. Model C is substantially lower than Model A and is less than 0.4 of the drain current of Model A when the drain voltage is in a range of 100 V to 600 V. Model D has significantly higher drain current as compared to Models B and C. In a range of 100 V to 600 V, Model D has a drain current that is at least 0.9 times the drain current of Model A.

FIG. 12 includes a plot of drain current as a function of time after the transistor structures are turned on after the transistor structures were off with a drain bias voltage of 400 V. When the drain voltage is 100 V and higher, the differences between Models B to D are significant. Model B does not show any significant current. Model C has a drain current of approximately 0.024 A/mm for the first 100 s. The drain current for Model C is approximately the same as the drain current of Model A after $1 \times 10^5$ s (approximately 28 hours). The drain current for Model D is the same as or higher than the drain current of Model A when the transistor structures are turned on and at least until $1 \times 10^5$ s (approximately 28 hours) and likely longer.

Accordingly, Model D, which corresponds to the transistor structure that is ion implanted as illustrated in FIG. 5, has substantially better dynamic $R_{ON}$ as compared to Model C (transistor structure with no ion implant) or Model B (transistor structure with ion implant only under source and drain electrodes). Thus, the transistor structure having the ion implant as illustrated in FIG. 5 is significantly more responsive when turned on. Transient effects, such as drain current lagging after turning on the transistor structure, can be eliminated or at least significantly reduced.

After ion implant, thermal cycles to which the transistor structure is exposed may be limited in temperature in order to keep crystal defects to a desired level. For example, a relatively high temperature may cause crystal defects to heal. In an embodiment, the highest temperature to which the workpiece is exposed after the ion implant may be at most 750° C., at most 600° C., or at most 500° C. The transistor structure may be exposed to heat during a packaging or other post-wafer fabrication operation. The temperature of the operation may be greater than 110° C. In a particular embodiment, the temperature may not exceed 400° C., and therefore, crystal defects that correspond to leakage paths can still be present.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a transistor structure. A process of forming the electronic device can include providing a workpiece including a substrate, a first layer, and a channel layer including a compound semiconductor material; and implanting a species into the workpiece such that the projected range extends at least into the channel and first layers, and the implant is performed into an area corresponding to at least a source region of the transistor structure.

Embodiment 2. The process of Embodiment 1, wherein implanting the species is performed such that the area corresponds to all or substantially all area occupied of the transistor structure.

Embodiment 3. The process of Embodiment 1, wherein the workpiece is not exposed to a thermal cycle at most 750° C. after implanting the species.

Embodiment 4. The process of Embodiment 3, wherein implanting the species is performed such that the species includes $H^+$ ions.

Embodiment 5. The process of Embodiment 3, wherein implanting the species is performed to a dose of at least $1 \times 10^{11}$ ions/cm$^2$.

Embodiment 6. The process of Embodiment 3, wherein implanting the species is performed to a dose of at most $1 \times 10^{15}$ ions/cm$^2$.

Embodiment 7. The process of Embodiment 6, wherein implanting the species is performed such that the dose is at least $5 \times 10^{13}$ ions/cm$^2$.

Embodiment 8. The process of Embodiment 3, wherein implanting the species is performed at an energy of at least 0.1 MeV.

Embodiment 9. The process of Embodiment 3, wherein implanting the species is performed at an energy of at most 5.0 MeV Embodiment 10. The process of Embodiment 1, wherein implanting the species is performed with a tilt angle in a range of 0° to 10°.

Embodiment 11. The process of Embodiment 10, wherein implanting the species is performed with a rotational angle that is within 5° of $(2x+1)*22.5°$, wherein x is a whole number in a range of 0 to 7.

Embodiment 12. The process of Embodiment 1, further including forming a source electrode, a gate electrode, and a drain electrode.

Embodiment 13. The process of Embodiment 12, wherein implanting the species is performed after forming the gate electrode.

Embodiment 14. The process of Embodiment 13, wherein providing the workpiece is performed such that a barrier layer overlies the channel layer.

Embodiment 15. The process of Embodiment 14, wherein providing the workpiece is performed such that the barrier layer includes $In_{(1-a-b)}Al_aGa_bN$, where $0 \leq a \leq 1$ and $0 \leq b \leq 1$.

Embodiment 16. The process of Embodiment 13, wherein providing the workpiece is performed such that the first layer includes an intermediate layer that underlies and contacts the channel layer, wherein the intermediate layer has a thickness of at most 1500 nm, and the intermediate and channel layers have semiconductor compositions that include a same cation.

Embodiment 17. The process of Embodiment 16, wherein providing the workpiece is performed such that the first layer includes a nucleation layer disposed between the substrate and the intermediate layer.

Embodiment 18. The process of Embodiment 17, wherein providing the workpiece is performed such that the first layer includes a stress relief layer disposed between the nucleation layer and the stress relief layer.

Embodiment 19. An electronic device can include a HEMT structure. A process of forming the electronic device can include providing a workpiece that includes a substrate; a first layer overlying the substrate, wherein a particular layer within the first layer is carbon doped at concentration of at least $1 \times 10^{16}$ atoms/cm$^3$; an intermediate layer overlying the first layer, wherein the intermediate layer includes $Al_{(1-x)}Ga_xN$, where $0 < x \leq 1$, and is carbon-doped at a concentration of at least $1 \times 10^{16}$ atoms/cm$^3$; a channel layer overlying the intermediate layer, wherein the channel layer includes GaN and is carbon doped at a concentration less than the intermediate layer; and a barrier layer overlying the channel layer, wherein the barrier layer includes $In_{(1-a-b)}Al_aGa_bN$, where $0 \leq a \leq 1$, $0 \leq b \leq 1$. The process can further include forming a source electrode and a drain electrode, wherein the source and drain electrodes contact to the barrier layer; forming a gate electrode overlying the barrier layer and between the source and drain electrodes; and implanting a species into the workpiece such that the projected range extends at least into the at least one first layer, and the implant is performed as a blanket implant, after forming the source, gate, and drain electrodes.

Embodiment 20. The process of Embodiment 19, wherein providing the workpiece is performed such that the at least one layer includes a nucleating layer and a stress relief layer, wherein the nucleation layer is disposed between the substrate and the stress relief layer and has an electron donor concentration of at least $1 \times 10^{18}$ atoms/cm$^3$; and the stress relief layer is disposed between the nucleation layer and the intermediate layer includes at least one film that includes $Al_{(1-z)}Ga_zN$, where $0 < z \leq 1$, and has an electron donor concentration of at least $1 \times 10^{18}$ atoms/cm$^3$.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device including a transistor structure, the process comprising:
   providing a workpiece including a substrate, a first layer overlying and contacting the substrate, and a channel layer including a compound semiconductor material, wherein the substrate has a primary surface, and the first layer is disposed between the primary surface of the substrate and the channel layer;
   forming a gate electrode of a high electron mobility transistor over the primary surface of the substrate and a gate region of the transistor structure; and
   implanting a species into the workpiece such that a projected range extends at least into the channel layer and the first layer, wherein
      implanting the species forms crystal defects within the gate region,
      a leakage path between the substrate and the gate electrode includes the crystal defects, and
      the transistor structure is an enhancement-mode high electron mobility transistor.

2. The process of claim 1, wherein the implanting the species is performed such that the area corresponds to all or substantially all area occupied by the transistor structure.

3. The process of claim 1, wherein the workpiece is not exposed to a thermal cycle over 600° C. after implanting the species.

4. The process of claim 3, wherein the implanting the species is performed such that the species includes H+ ions.

5. The process of claim 3, wherein the implanting the species is performed to a dose of at least $1\times10^{11}$ ions/cm$^2$.

6. The process of claim 3, wherein the implanting the species is performed to a dose of at most $1\times10^{15}$ ions/cm$^2$.

7. The process of claim 6, wherein the implanting the species is performed such that the dose is at least $5\times10^{13}$ ions/cm$^2$.

8. The process of claim 3, wherein the implanting the species is performed at an energy of at least 0.1 MeV.

9. The process of claim 3, wherein the implanting the species is performed at an energy of at most 5.0 MeV.

10. The process of claim 1, wherein the implanting the species is performed with a tilt angle in a range of 0° to 10°.

11. The process of claim 10, wherein the implanting the species is performed with a rotational angle that is within 5° of (2x+1)*22.5°, wherein x is a whole number in a range of 0 to 7.

12. The process of claim 1, wherein the providing the workpiece is performed such that a barrier layer overlies the channel layer.

13. The process of claim 1, wherein the providing the workpiece is performed such that the first layer comprises an intermediate layer that underlies and contacts the channel layer, wherein the intermediate layer has a thickness of at most 1500 nm, and the intermediate and channel layers have semiconductor compositions that include a same cation.

14. The process of claim 1, wherein the providing the workpiece is performed such that the first layer further comprises a stress relief layer disposed between the substrate and the channel layer.

15. The process of claim 14, wherein the providing the workpiece is performed such that the first layer comprises a nucleation layer disposed between the substrate and the stress relief layer.

16. The process of claim 1, wherein forming the first layer comprises:
   forming a nucleation layer over the primary surface of the substrate; and
   forming a stress relief layer over the nucleation layer, wherein the stress relief layer has an electron donor concentration of at least $1\times10^{18}$ atoms/cm$^3$.

17. The process of claim 1, wherein providing the workpiece comprises:
   forming the first layer comprises:
      forming a nucleating layer over and contacting the substrate, wherein the nucleating layer has a thickness in a range of 20 nm to 1000 nm,
      forming a stress relief layer over the nucleating layer, wherein the stress relief layer has a thickness in a range of 1 micron to 10 microns, and wherein the nucleating layer includes one or more elements that are common to the stress relief layer, and
      forming an intermediate layer over the stress relief layer, wherein the intermediate layer that has a thickness in a range of 50 nm to 1500 nm,
   forming the channel layer over the stress relief layer, wherein the channel layer includes GaN and has a thickness is in a range of 20 nm to 2000 nm,
   forming a barrier layer over the channel layer, wherein the barrier layer includes In$_{(1-a-b)}$Al$_a$Ga$_b$N, where 0≤a≤1 and 0≤b≤1, and has a thickness is in a range of 0.5 nm to 200 nm, and
   implanting the species comprises implanting the species into at least into the barrier layer, the channel layer, intermediate layer, the stress relief layer, and the nucleating layer, the implanting the species is performed to a dose in a range from $5\times10^{13}$ ions/cm$^2$ to $1\times10^{15}$ ions/cm$^2$, and the implanting the species is performed at an energy in a range of 0.1 MeV to 5.0 MeV.

18. The process of claim 17, wherein providing the workpiece comprises:
   forming the nucleating layer comprises forming the nucleating layer such that the nucleating layer is carbon-doped at a concentration of at least $1\times10^{16}$ atoms/cm$^3$,
   forming the intermediate layer comprises forming the intermediate layer such that the intermediate layer is carbon-doped at a concentration of at least $1\times10^{16}$ atoms/cm$^3$, and
   forming the channel layer comprises forming the channel layer such that the channel layer is carbon doped at a concentration less than the stress relief layer.

19. A process of forming an electronic device including a transistor structure, the process comprising:
   providing a workpiece including a substrate, a first layer overlying and contacting the substrate, and a channel layer including a compound semiconductor material, wherein the substrate has a primary surface, and the first layer is disposed between the primary surface of the substrate and the channel layer;
   forming a source electrode of a high electron mobility transistor over the primary surface of the substrate and a source region of the transistor structure;

forming a gate electrode of the high electron mobility transistor over the primary surface of the substrate and a gate region of the transistor structure and implanting a species into the workpiece such that a projected range extends at least into the channel layer and the first layer, wherein:
- implanting the species forms crystal defects within the source region, the gate region, and a region between the source region and the gate region,
- leakage paths between the substrate and each of the source electrode and the gate electrode include the crystal defects, and
- the transistor structure is an enhancement-mode high electron mobility transistor.

20. A process of forming an electronic device including a transistor structure, the process comprising:

providing a workpiece including a substrate, a first layer overlying and contacting the substrate, and a channel layer including a compound semiconductor material, wherein the substrate has a primary surface, and the first layer is disposed between the primary surface of the substrate and the channel layer;

forming a source electrode of a high electron mobility transistor over the primary surface of the substrate and a source region of the transistor structure;

forming a gate electrode of the high electron mobility transistor over the primary surface of the substrate and a gate region of the transistor structure;

forming a drain electrode of the high electron mobility transistor over the primary surface of the substrate and a drain region of the transistor structure; and implanting a species into the workpiece such that a projected range extends at least into the channel layer and the first layer, wherein:
- implanting the species forms crystal defects within the source region, the gate region, the drain region, a region between the source region and the gate region, and another region between the gate region and the drain region,
- leakage paths between the substrate and each of the source electrode, the gate electrode, and the drain electrode include the crystal defects, and
- the transistor structure is an enhancement-mode high electron mobility transistor.

* * * * *